United States Patent
Wu

(10) Patent No.: US 11,632,135 B2
(45) Date of Patent: Apr. 18, 2023

(54) APPARATUSES AND METHODS FOR INTERLEAVED BCH CODES

(71) Applicant: Micron Technology, Inc., Boise, ID (US)

(72) Inventor: Yingquan Wu, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 374 days.

(21) Appl. No.: 16/415,218

(22) Filed: May 17, 2019

(65) Prior Publication Data

US 2019/0273515 A1 Sep. 5, 2019

Related U.S. Application Data

(63) Continuation of application No. 15/222,057, filed on Jul. 28, 2016, now Pat. No. 10,333,555.

(51) Int. Cl.
*H03M 13/27* (2006.01)
*H03M 13/29* (2006.01)
*H03M 13/15* (2006.01)

(52) U.S. Cl.
CPC ..... *H03M 13/2792* (2013.01); *H03M 13/152* (2013.01); *H03M 13/2906* (2013.01)

(58) Field of Classification Search
CPC ........... H03M 13/2792; H03M 13/152; H03M 13/2906; G06F 11/1068; G11C 29/52
See application file for complete search history.

(56) References Cited

U.S. PATENT DOCUMENTS

| 5,946,328 | A | * | 8/1999 | Cox | ................... G11B 20/1833 |
| | | | | | 714/784 |
| 8,161,360 | B1 | | 4/2012 | Wu | |
| 8,433,979 | B2 | | 4/2013 | Blaum et al. | |
| 9,077,378 | B2 | | 7/2015 | Wu | |
| 2004/0181735 | A1 | * | 9/2004 | Xin | ..................... H03M 13/159 |
| | | | | | 714/758 |
| 2009/0077448 | A1 | | 3/2009 | Haas et al. | |
| 2012/0131423 | A1 | | 5/2012 | Wu | |
| 2013/0013974 | A1 | | 1/2013 | Cideciyan et al. | |
| 2013/0132793 | A1 | | 5/2013 | Ha et al. | |
| 2014/0215285 | A1 | * | 7/2014 | Wu | ....................... H03M 13/13 |
| | | | | | 714/752 |
| 2015/0095735 | A1 | | 4/2015 | Wu et al. | |

OTHER PUBLICATIONS

Blaum, et al. "Partial-MDS Codes and Their Application to RAID Type of Architectures", IEEE Transactions on Information Theory, vol. 59, No. 7, Jul. 2013, pp. 4510-4519.

(Continued)

*Primary Examiner* — April Y Blair
*Assistant Examiner* — Rong Tang
(74) *Attorney, Agent, or Firm* — Brooks, Cameron & Huebsch, PLLC

(57) ABSTRACT

An example methods for interleaved BCH codes can include encoding a plurality of portions of data using a first generator polynomial to obtain a plurality of respective BCH codewords. The method can include encoding an additional BCH codeword based at least in part on a second plurality of portions of data and the plurality of BCH codewords using a second generator polynomial. The method can include outputting the plurality of respective BCH codewords and the additional BCH codeword.

19 Claims, 3 Drawing Sheets

(56) References Cited

OTHER PUBLICATIONS

Abdel-Ghaffar, et al. "Multilevel Error-Control Codes for Data Storage Channels", IEEE Transactions on Information Theory, vol. 37, No. 3, May 1991, pp. 735-741.

Hassner, et al. "Integrated Interleaving—A Novel ECC Architecture", IEEE Transactions on Magnetics, vol. 37, No. 2, Mar. 2001, pp. 773-775.

Tang, et al. "A Novel Method for Combining Algebraic Decoding and Iterative Processing", IEEE International Symposium on Information Theory, Seattle, WA, USA, Jul. 2006, pp. 474-478.

Blaum, et al. "Generalized Concatenated Types of Codes for Erasure Correction", <http://arxiv.org/abs/1406.6270>, San Jose, CA, USA, Jul. 11, 2014, 28 pp.

Tang, et al. "On the Performance of Integrated Interleaving Coding Schemes", IEEE International Symposium on the Information Theory, Chicago, IL, USA, 2002, pp. 267-271.

Maucher, et al. "On the Equivalence of Generalized Concatenated Codes and Generalized Error Location Codes", IEEE Transaction on Information Theory, vol. 46, No. 2, Mar. 2000, pp. 642-649.

McEliece, et al. "On the Decoder Error Probability for Reed-Solomon Codes". IEEE Transactions on Information Theory, vol. 32, No. 5, Sep. 1986, pp. 701-703.

Wu "New List Decoding Algorithms for Reed-Solomon and BCH Codes", IEEE Transactions on the Information Theory, vol. 54, No. 8, Aug. 2008, 3611-3630.

International Search Report and Written Opinion from related international application No. PCT/US2017/040837, dated Oct. 17, 2017, 13 pp.

Wu, Yingquan "Generalized Integrated Interleaving BCH Codes", IEEE International Symposium on Information Theory, Jul. 10-15, 2016, pp. 1098-1102.

Wu, Y., "A New Encoding Method for Integrated-Interleaved Codes", IEEE International Symposium on Information Theory, Jun. 2010, Austin, TX, pp. 983-987.

\* cited by examiner

APPARATUSES AND METHODS FOR INTERLEAVED BCH CODES

PRIORITY INFORMATION

This application is a Continuation of U.S. application Ser. No. 15/222,057 filed Jul. 28, 2016, the contents of which are included herein by reference.

TECHNICAL FIELD

The present disclosure relates generally to semiconductor memory and methods, and more particularly, to apparatuses and methods related to interleaved BCH codes.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in portable electronic devices, such as laptop computers, portable memory sticks, digital cameras, cellular telephones, portable music players such as MP3 players, movie players, and other electronic devices. Memory cells can be arranged into arrays, with the arrays being used in memory devices.

To ensure data integrity, error correction codes can be used to detect and correct certain numbers and/or types of errors in the data. One type of error correction involves integrated interleaved codes. Integrated interleaved codes can be systematic codes (i.e., input data is included or otherwise embedded in the encoded data) and can generate multiple codewords, each of which can be at a particular level. Powerful error correction may be desired but balanced against latency, throughput, and/or power constraints such as those imposed by portable electronic devices.

DETAILED DESCRIPTION

Figure 1:
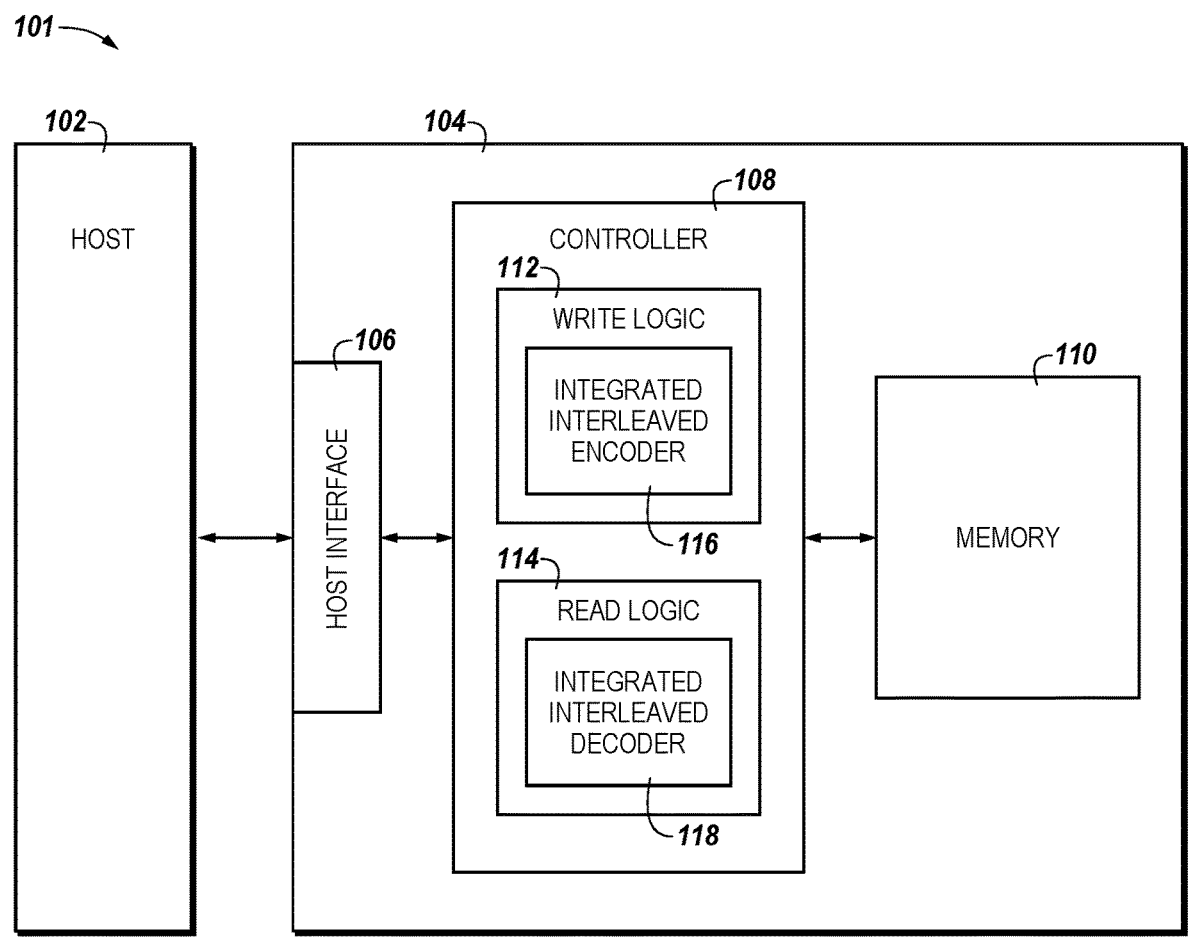
FIG. 1 is a block diagram of a system for implementing interleaved BCH codes in accordance with a number of embodiments of the present disclosure.

The present disclosure includes apparatuses and methods related to interleaved BCH codes. A number of methods can include encoding a plurality of portions of data using a first generator polynomial to obtain a plurality of respective BCH codewords. The number of methods can include encoding an additional BCH codeword based at least in part on a second plurality of portions of data and the plurality of BCH codewords using a second generator polynomial. The number of methods can include outputting the plurality of respective BCH codewords and the additional BCH codeword.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 220 may reference element "20" in FIG. 2, and a similar element may be referenced as 320 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of computing system 101 for implementing interleaved BCH codes in accordance with a number of embodiments of the present disclosure. As used herein, the computing system 101 can include a host 102 and a memory device 104. The memory device 104 can include a host interface 106, a controller 108, and a memory array 110.

The host 102 can be coupled (e.g., connected) to memory device 104, which includes the memory array 110. Host 102 can be a host system such as a personal laptop computer, a desktop computer, a digital camera, a smart phone, or a memory card reader, among various other types of hosts. Host 102 can include a system motherboard and/or backplane and can include a number of processing resources (e.g., one or more processors, microprocessors, or some other type of controlling circuitry). The system 101 can include separate integrated circuits or both the host 102 and the memory device 104 can be on the same integrated circuit. The system 101 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 101 has been simplified to focus on features with particular relevance to the present disclosure. The memory array 110 can be a hybrid memory cube (HMC), processing in memory random access memory (PIMRAM) array, DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines. Although a single array 110 is shown in FIG. 1, embodiments are not so limited. For instance, memory device 104 may include a number of arrays (e.g., a number of banks of DRAM cells).

The controller 108 can be coupled to the host interface 106 and to the memory 110 via a plurality of channels (not shown) and can be used to transfer data between the memory system 104 and a host 102. The host interface 106 can be in the form of a standardized interface. For example, when the memory system 104 is used for data storage in a computing system 101, the host interface 106 can be a serial advanced technology attachment (SATA), peripheral component interconnect express (PCIe), or a universal serial bus (USB), among other connectors and interfaces. In general, however, the host interface 106 can provide an interface for passing control, address, data, and other signals between the memory system 104 and a host 102 having compatible receptors for the host interface 106.

The controller 108 can include write logic 112 and read logic 114. Controller 108 can cause data to be written to memory array 110 and/or additional memory locations and can cause data to be read back from the memory array 110. Prior to storing data in the memory array 110, data can be encoded using an integrated interleaved encoder 116. When the data is read from the memory array 110, the data can be read from the memory array 110 and decoded using an integrated interleaved decoder 118. In some examples, a read back from the memory array 110 can have noise or errors in the data and using an integrated interleaved code can allow the read-back errors to be corrected.

Figure 3:
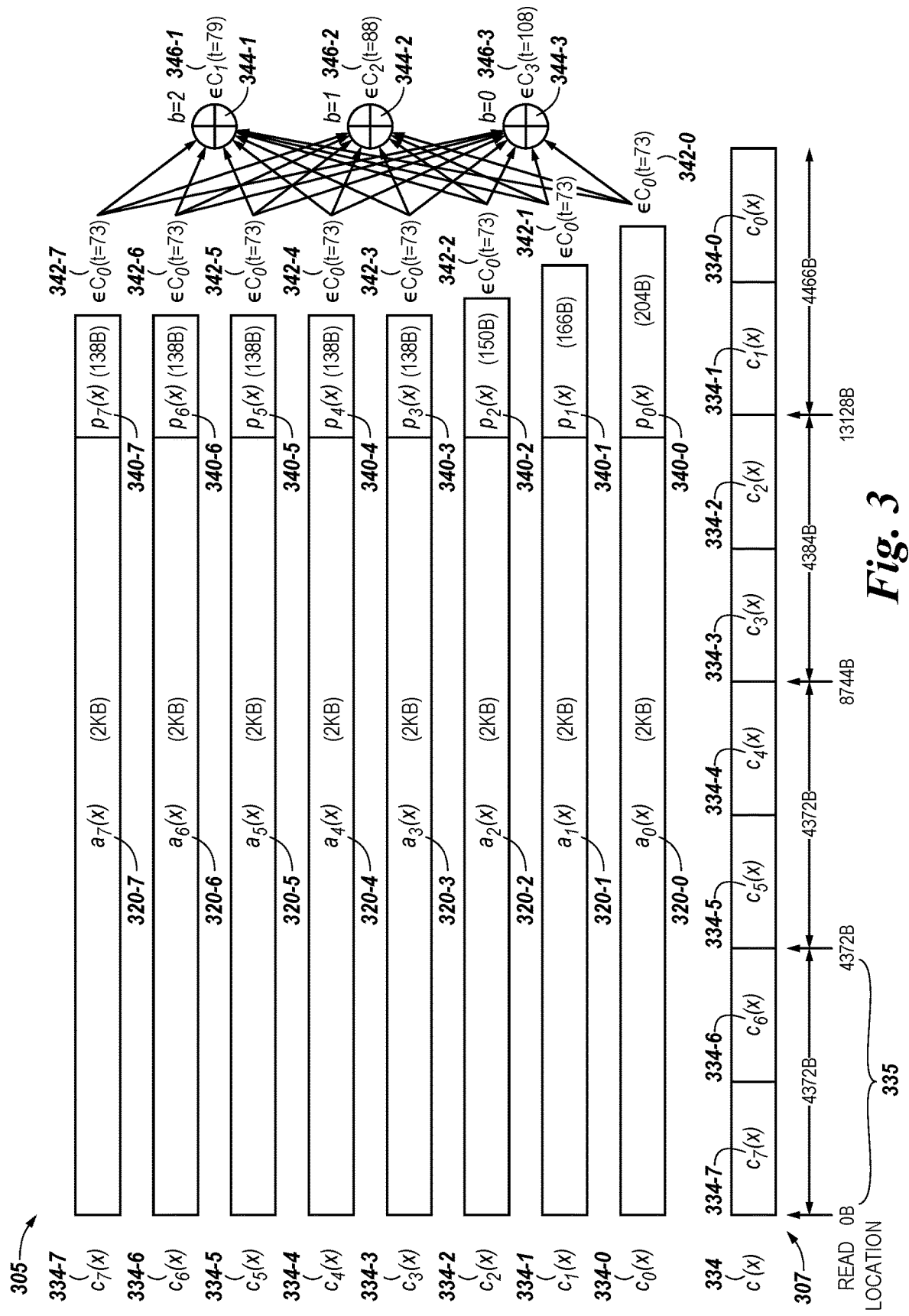
FIG. 3 illustrates an example of a diagram for generalized integrated interleaving of BCH codes in accordance with a number of embodiments of the present disclosure.

To achieve better error protection over an array of interleaves within a single cluster or block of data, a two-level interleaved scheme can be used and a generalized interleaved scheme can provide nonuniform redundancy (see FIG. 3). An array of interleaves refers to data arranged in a noncontiguous manner. Interleaving can refer to dividing memory into small chunks and used as a high-level technique to solve memory issues for motherboards and chips. In this way, interleaving can control errors with particular methods. The nonuniform redundancy is provided by using extra check symbols that are shared among all the interleaves and used by interleaves with errors beyond their decoding distance. However, this construction may not provide protection to the shared redundancies. Instead, another code can be required to protect these shared check symbols from errors. The integrated interleaving (II) coding scheme can provide an improvement of error correction by creating shared redundancy that is protected by the first-layer code. Specifically, the II coding scheme nests a set of m equally protected interleaves with v (v<m) more powerful codewords in the nested layer which is a subcode of the first layer. Specifically, let $\{\mathcal{C}_i(n, k_i, d_i)\}_{i=0}^{1}$ be defined over the Galois field GF(q) such that $\mathcal{C}_1 \subset \mathcal{C}_0$. An II code is defined as follows:

$$C \triangleq \left\{ c = [c_0, c_1, c_2, \ldots, c_{m-1}]: c_i \in C_0, \sum_{i=0}^{m-1} \alpha^{bi} c_i \in C_1, b = 0, 1, 2, \ldots, v-1 \right\}, \quad (1)$$

where v<m<q. The above defined II code enables correction of up to v interleaves that are failed by self-decoding. Self-decoding refers to a decoding that is performed using codewords associated with a particular portion of data without referencing codewords at a higher level. For example, a lower level codeword (e.g., codeword 334-0 in FIG. 3) can decode a portion of data (e.g., data $a_0x$ 320-0) without referencing higher level codewords (e.g., such as codeword $C_0$ 342 and/or codeword $C_3$ 346-3).

A generalized two-layer II coding scheme allows unequal protection in the nested layer. Specifically, let $\{\mathcal{C}_i(n, k_i, d_i)\}_{i=0}^{v}$ be defined over the Galois field GF(q) such that $$C_v \subseteq C_{v-1} \subseteq C_{v-2} \subseteq \ldots \subseteq C_1 \subseteq C_0 \quad (2)$$

A generalized integrated interleaved (GII) code is defined as $$C \triangleq \left\{ c = [c_0, c_1, c_2, \ldots, c_{m-1}]: c_i \in c_0, \sum_{i=0}^{m-1} \alpha^{bi} c_i \in C_{v-b}, 0 \le b < v \right\}, \quad (3)$$

where v<m<q. As described further below, the proposed definition illustrates an implementation for both encoder and decoder. Some benefits can include a GII codeword exhibiting larger minimum distance and more powerful performance. When up to v component words are failed by self-decoding, it can be highly unlikely that all failed words have equal number of errors. Instead, the worst corrupted word can entail the largest correction power, whereas the least corrupted word can entail the smallest correction power.

The GII scheme is similar to a generalized concatenated (GC) scheme in view of theoretical performance and shared redundancies on top of the first layer self-correction. The main difference and advantage of GII codes can be that their shared redundancies are also embedded in, and thus protected by, the first-layer interleaves, whereas for GC codes, the shared redundancies may not be. The nested layer codes form a subcode order and are subcodes of the first-layer code (see Equation (2)) in GII codes, whereas the inner (but not outer) codes forms a subcode order and are used to encode each symbol of outer codes in GC codes. The nested layer codes and the first-layer code can share the same field and code length in GII codes, however, the outer codes can be defined in a larger field and thus have much larger length than the inner codes in GC codes. As a consequence, the implementation and architecture of GII codes can be different from the schemes of the GC codes.

In some embodiments, the size of a flash page is 16 kilobyte (KB)+8-12% overhead, and can continue increasing in order to increase capacity while maintaining throughput (note data for a flash page is programmed altogether). On the other hand, a data sector size is currently 4 KB, therefore, multiple sectors must be buffered until a page is filled before programming. Binary b (BCH) codes have been extensively employed to tackle bit corruptions caused by retention. The GII-BCH scheme does not cause write latency, and moreover, each sector can be read out independently under normal conditions (meaning each sector is correctable by the first layer self-decoding). In some embodiments, formal efficiency can be traded off with power consumption. In previous approaches, a data sector was in the form of 512B initially, then shifted to 4 KB, and is gradually moving to 8 KB. The format efficiency found in longer code lengths diminishes after 2 KB for prevalent coding schemes, while circuit complexity and power consumption roughly increases linearly with code length. To this end, GII codes serve as an alternative to be more complex but also more efficient than simple interleaves, on the other hand, less complex but also less efficient than a single code.

For various potential applications of II/GII codes, it can be beneficial to make the miscorrection negligible for the interleave self-decoding, since it enables decoding of each interleave independently under normal operation where the noise level is below the error correction capability. On the other hand, this may not be a stringent condition to meet. For Reed Solomon (RS) or BCH codes with relatively large minimum distances, the miscorrection probability is below the level of practical tolerance. This also significantly simplifies the nested decoding and the corresponding performance analysis. Also, in some approaches, decoding methods proposed for II/GII codes are can be computationally inefficient, in two perspectives, where the two perspectives include a syndrome computation and key-equation-solver. A syndrome refers to multiplying a parity check matrix times a particular vector. For example, codewords of a code have a syndrome of zero when the codeword include no errors and if all syndromes are zero, decoding can be completed. The previous method approaches can rebuild corrupted nested interleaves and then compute their syndromes. This can be more efficiently achieved by computing syndromes on the constructed nested (corrupted) interleaves only on the first time while updating syndromes by removing contributions from the corrected interleaves at each iteration of decoding attempt. Moreover, syndromes for existing uncorrectable interleaves can remain valid and each subsequent attempt will incrementally add high order syndromes in order to correct the previously uncorrectable interleaves. Additionally, when the method is deployed to decode interleaves, the output of the BM method can be readily reused in the next iteration by incorporating extra syndromes.

Figure 2:
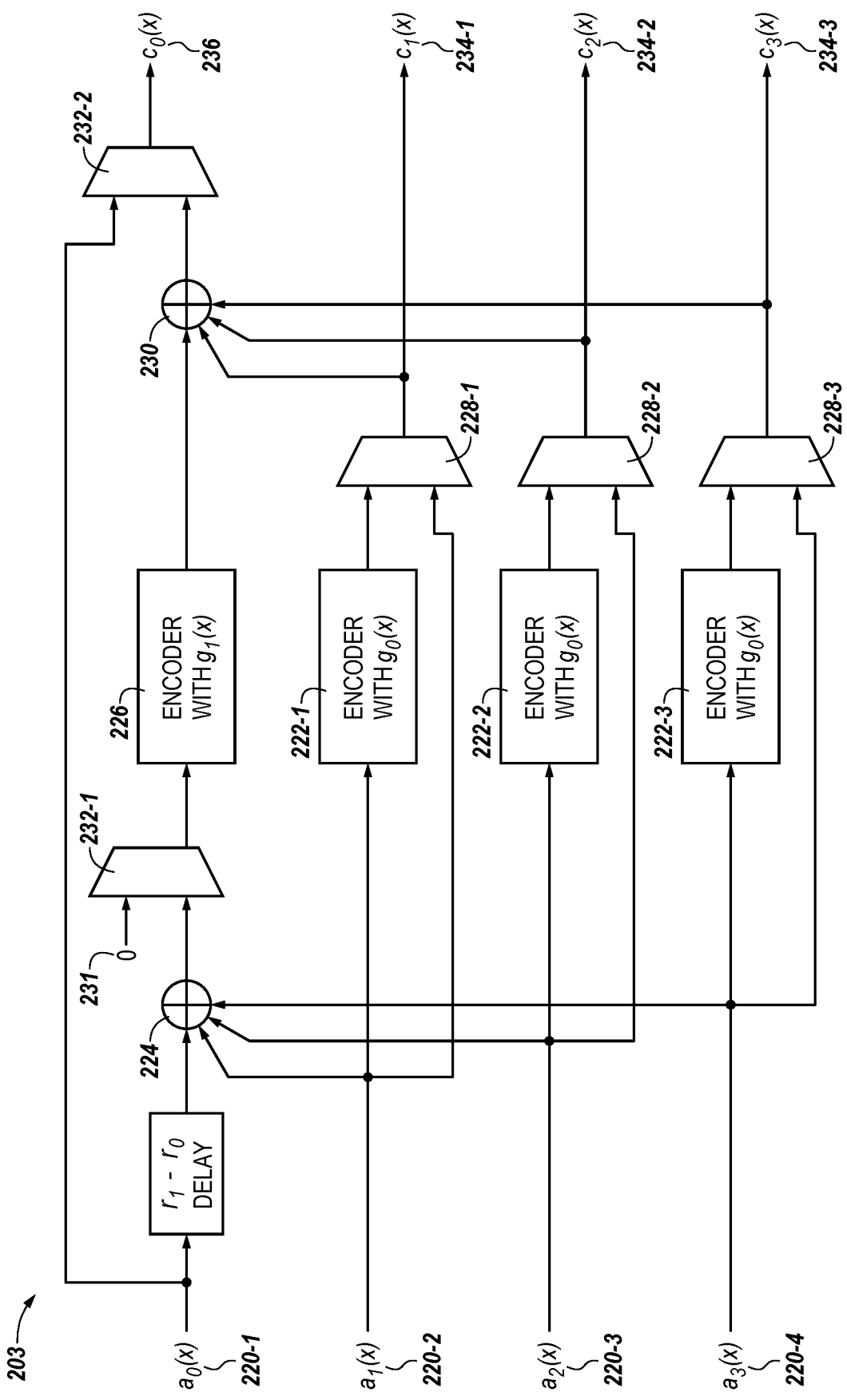
FIG. 2 illustrates an example of a diagram for integrated interleaved encoding in accordance with a number of embodiments of the present disclosure.

FIG. 2 illustrates an example of a diagram 203 for integrated interleaved encoding in accordance with a number of embodiments of the present disclosure. The diagram 203 includes a plurality of data polynomials such as $a_0(x)$ 220-1, $a_1(x)$ 220-2, $a_2(x)$ 220-3, and $a_3(x)$ 220-4 (herein referred to in combination as 220). The diagram 203 includes a plurality of encoders 222-1, 222-2, 222-3, 226 (herein referred to in combination as 222, 226), and a plurality of codewords 234-1, 234-2, 234-3, 236 (herein referred to in combination as 234, 236). Encoders 222-1, 222-2, 222-3 use a plurality of generator polynomials (e.g., g(x)) to encode the plurality of data polynomials 220. Cyclic codes, including BCH codes, can be systematically encoded by a simple linear-feedback-shift-register (LF SR) circuit. Specifically, an LFSR encoder systematically encodes a data polynomial a(x) 220 to a systematic codeword c(x) 234, 236 through iteratively dividing $-x^r a(x)$ by corresponding generator polynomials g(x). In the equation $-x^r a(x)$, r denotes parity length, and a(x) denotes a message polynomial. A systematic codeword includes an original data polynomial a(x) 220 (e.g., input data or data prior to encoding) and a resulting remainder polynomial p(x), where the LFSR encoding is illustrated by:

$$\varepsilon(a(x), g(x)) \to c(x) \triangleq \lfloor a(x), p(x) \rfloor$$

A systematic codeword can be indexed in the reverse in a polynomial representation illustrated by $$c = [c_{n-1}, c_{n-2}, \ldots, c_1, c_0].$$

In at least some embodiments, systematic encoding includes input data being embedded in encoded data (e.g., as codewords) and becomes output data. In at least some examples with a single nested word, i.e., v=1, input data can be in a beginning portion of a codeword. Redundant data (e.g., bits, bytes and/or symbols) can be added by systematically encoding using generator polynomials $g_0(x)$ and $g_1(x)$, where $g_0(x)$ divides $g_1(x)$. As illustrated in FIG. 2, the encoders 222-1, 222-2, 222-3 are configured to to respectively input and systematically encode input data $a_1(x)$, $a_2(x)$, $a_3(x)$ using $g_0(x)$. Codewords $c_1(x)$, $c_2(x)$, and $c_3(x)$ are correspondingly output by systematic encoders 222-1, 222-2, 222-3. To obtain the remaining codewords, a systematic encoding with respect to generator polynomial $g_1(x)$ is performed. Data polynomials $\alpha_0(x)$ 220-1 through $\alpha_3(x)$ 220-4 are correlated with a $r_1$-$r_0$ delay 229 and input to adder 224 which outputs a sum of the input. The $r_1$-$r_0$ delay 229 refers to deferring encoding until a clock number $r_1$-$r_0$, which is related to a delay unit of $r_1$-$r_0$. The delay unit refers to a shift-align of $a_0(x)$ with remaining input data $a_1(x)$, $a_2(x)$, $a_3(x)$, noting that $a_0(x)$ is shorter by $r_1$-$r_0$ bits. The sum in turn becomes input to a multiplexer 232-1. In addition, additional data (e.g., multiplexing with "0") 231 is input into multiplexer 232-1. Output data of multiplexer 232-1 becomes input data for encoder 226 which systematically encodes the sum using $g_1(x)$ and outputs an intermediate portion of data.

In at least one embodiment, data polynomial $a_0(x)$ 220-1 is received by a multiplexer 232-2 as a first input of data. A second input of data into the multiplexer 232-2 is from adder 230. Adder 230 receives as input redundant data output from encoder 226, and inverted or negative redundant data that are output data from encoders 222-1, 222-2, 222-3, respectively. A select signal (not illustrated) is configured to select an appropriate input at an appropriate time from each corresponding encoder. Although some of the equations and/or descriptions are associated with a particular number of encoders and/or data inputs and outputs, embodiments are not so limited.

In some previous approaches, a systematic encoding method can be implemented for binary BCH code for a particular case where v=1. This is due to coefficients $\alpha^{bi}$ given in equation 3 being valid only with b=0. In the following description, a generalized integrated interleaving encoding method for BCH codes is described (where v>=1). In some embodiments, an integrating coefficient is substituted, say $\gamma \in GF(2^q)$, by its associated binary polynomial $$\gamma(x) \triangleq \gamma_{q-1}x^{q-1} + \gamma_{q-2}x^{q-2} + \ldots + r_1 x + \gamma_0 \quad (4)$$

where $\gamma_l \in GF(2)$, $t = 0, 1, \ldots, q-1$, and $$\gamma \triangleq [\gamma_{q-1}, \gamma_{q-2}, \ldots, \gamma_1, \gamma_0] \quad (5)$$
$$= \gamma_{q-1}\alpha^{q-1} + \gamma_{q-2}\alpha^{q-2} + \ldots + \gamma_1\alpha + \gamma_0.$$

This substitution includes the following properties, $$\alpha(x^j) = x^j \bmod \psi(x) \quad (6)$$

where $\alpha$ denotes a primitive element in $GF(2^q)$ that is defined by a primitive polynomial $\psi(x)$.

$$\alpha(\gamma) = \gamma, \forall \gamma \in GF(2^q), \quad (7)$$
$$\alpha^t(x) = \alpha(x^t), 0 \le t < 2^q, \quad (8)$$
$$\alpha^{-1}(x) - \alpha(x)^{-1}(\bmod \psi(x)). \quad (9)$$

A primitive element refers to a generator of a multiplicative group of a finite field GF(q). For example, $\alpha$ in the set of GF(q) is called a primitive element if it is a primitive (q−1) root of unity in GF(q). This means that all non-zero elements of GF(q) can be written as $a^i$ for some (positive) integer i.

A t-correcting BCH code $\mathcal{C}$ (n, k) defined over the Galois field $GF(2^q)$ has the following generator polynomial $$g(x) \triangleq LCM(m_1(x), m_2(x), \ldots, m_{2t-1}(x)) \quad (10)$$

where LCM denotes "the least common multiple", and $m_i(x)$ denotes the minimal (binary) polynomial to contain the root $\alpha^i$. Let $\{\mathcal{C}_i(n, k_i, d_i)\}_{i=0}^v$ be binary BCH codes satisfying $$C_0 \supset C_1 = \quad (11)$$
$$\ldots = C_{i_1} \supset C_{i_1+1} = \ldots = C_{i_2} \supset \ldots = C_{i_{s-1}} \supset C_{i_{s-1}+1} = \ldots = C_{i_s}$$

where $i_0=0$ and $i_s=v$. A GII-BCH code is given by $$C \triangleq \left\{ c = [c_0, c_1, c_2, \ldots, c_{m-1}] : c_i(x) \in C_0, \sum_{i=0}^{m-1} \alpha(x^{bi})c_i(x) \in C_{v-b}, 0 \le b < v \right\} \quad (12)$$

where $v < m < 2^q$. The next theorem characterizes the basic property of GII-BCH codes.

Theorem 1 Let $d^*_i$, i=0, 1, ... v, denote the actual (against the designed) minimum distance of the BCH code $\mathcal{C}_i$. The GII-BCH code $\mathcal{C}$ (N,K,$d^*_{min}$) is a binary linear code of length N=mn, dimension $K=\Sigma_{i=1}^v k_i+(m-v)k_0$, and minimum distance bounded by $$d^*_{min} \ge \min\{(v+1)d^*_0, (v-i_1+1)d^*_1, \ldots, (v-i_{s-1}+1)d^*_{i_{s-1}}, d^*_v\}. \quad (13)$$

Proof By the lemma, if there are i (i≤v) non-zero interleaves, then they must all lie in $\mathcal{C}_{v-i+1}$. This concludes the lower bound of minimum distance.

Lemma 1 Let $c_i(x)$, i=0, 1, ..., v−1, be BCH codewords in $\mathcal{C}_0$. If $$\begin{bmatrix} 1 & 1 & \ldots & 1 \\ \alpha(x) & \alpha(x^2) & \ldots & \alpha(x^{(v-1)}) \\ \vdots & \vdots & \ddots & \vdots \\ \alpha(x^{v-1}) & \alpha(x^{2(v-1)}) & \ldots & \alpha(x^{(v-1)(v-1)}) \end{bmatrix} \cdot \begin{bmatrix} c_0(x) \\ c_1(x) \\ \vdots \\ c_{v-1}(x) \end{bmatrix} \to \begin{bmatrix} c'_0(x) \\ c'_1(x) \\ \vdots \\ c'_{v-1}(x) \end{bmatrix} \quad (14)$$

lies in $\mathcal{C}_1$, where $\mathcal{C}_1 \subset \mathcal{C}_0$. Then, $c_i(x)$, i=0, 1, ..., v−1, must lie in $\mathcal{C}_1$.

Proof: It suffices to show that each $c_i(x)$, i=0, 1, ..., v−1, contains all roots of $$\frac{g_1(x)}{g_0(x)}.$$

Let $\gamma$ be a root of $$\frac{g_1(x)}{g_0(x)}.$$

Evaluating (15) with x=$\gamma$, we obtain $$\begin{bmatrix} 1 & 1 & \ldots & 1 \\ \gamma & \gamma^2 & \ldots & \gamma^{v-1} \\ \vdots & \vdots & \ddots & \vdots \\ \gamma^{v-1} & \gamma^{2(v-1)} & \ldots & \gamma^{(v-1)(v-1)} \end{bmatrix} \begin{bmatrix} c_0(\gamma) \\ c_1(\gamma) \\ \vdots \\ c_{v-1}(\gamma) \end{bmatrix} = \begin{bmatrix} 0 \\ 0 \\ \vdots \\ 0 \end{bmatrix}$$

Since the connection matrix is non-singular, the above equality indicates $$c_i(\gamma) = 0, i = 0, 1, \ldots, v-1.$$

Therefore, $c_i(x)$, i=0, 1, ..., v−1, all divide $g_1(x)$. We note from the above proof that, unlike a GII-Reed Solomon (RS) code whose minimum distance is precisely determined, the minimum distance of a GII-BCH code is loosely bounded. Following the convention of BCH characterizations, we define the designed minimum distance, denoted by $d_{min}$, for a GII-BCH code as $$d_{min} \triangleq \min\{(v+1)d_0, (v-i_1+1)d_1, \ldots, (v-i_{s-1}+1)d_{i_{s-1}}, d_v\}. \quad (15)$$

In at least one embodiment, a systematic encoding method which is modified is described below. For example, let $a_0(x)$, $a_1(x)$, $a_2(x)$, ..., $a_{m-1}(x)$ be data polynomials, satisfying $\deg(a_i(x)) < k_{v-i}$, $0 \leq i < v$, and $\deg(a_j(x)) < k_0$, $v \leq j < m$. Assume that $a_v(x)$, $a_{v+1}(x)$, ..., $a_{m-1}(x)$, are systematically encoded to $c_v(x)$, $c_{v+1}(x)$, ..., $c_{m-1}(x)$, respectively, utilizing the generator polynomial $g_0(x)$. We are interested in determining systematic codewords, $$c_i(x) \triangleq [a_i(x), p_i(x)](\deg(p_i(x)) < r_{v-i}),$$

$i = 0, 1, \ldots, v-1$, satisfying:

$$\begin{cases} c_0(x) & +c_1(x) & +\ldots+c_{v-1}(x) & \equiv \sum_{k=v}^{m-1} c_i(x)(\mathrm{mod} g_v(x)) \\ c_0(x) & +\alpha(x)c_1(x) & +\ldots+\alpha(x^{v-1})c_{v-1}(x) & \equiv \sum_{k=v}^{m-1} \alpha(x^i)c_i(x)(\mathrm{mod} g_{v-1}(x)) \\ c_0(x) & +\alpha(x^2)c_1(x) & +\ldots+\alpha(x^{2(v-1)})c_{v-1}(x) & \equiv \sum_{k=v}^{m-1} \alpha(x^{2i})c_i(x)(\mathrm{mod} g_{v-2}(x)) \\ \vdots & \vdots & \ddots \vdots & \vdots \\ c_0(x) & +\alpha(x^{v-1})c_1(x) & +\ldots+\alpha(x^{(v-1)(v-1)})c_{v-1}(x) & \equiv \sum_{k=v}^{m-1} \alpha(x^{i(v-1)})c_i(x)(\mathrm{mod} g_1(x)) \end{cases} \quad (16)$$

To solve for $c_{v-1}(x)$, we again relax from mod $g_i(x)$, $i=1, 2, \ldots, v$, in the above system to mod $g_1(x)$. Denote by $\Gamma^{(i)}(x)$ the inverse matrix $$\Gamma^{(i)}(x) \triangleq [\Gamma_0^{(i)}(x), \Gamma_1^{(i)}(x), \ldots, \Gamma_i^{(i)}(x)]^T \quad (17)$$

$$\triangleq \begin{bmatrix} 1 & 1 & 1 & \ldots & 1 \\ 1 & a(x) & a^2(x) & \ldots & a^i(x) \\ \vdots & \vdots & \vdots & \ddots & \vdots \\ 1 & a^i(x) & a^{2i}(x) & \ldots & a^{i^2}(x) \end{bmatrix}^{-1} (\mathrm{mod} g_{v-i}(x))$$

and by $\Theta^{(i)}(x)$ the matrix $$\Theta^{(i)}(x) \triangleq \begin{bmatrix} 1 & 1 & \ldots & 1 \\ a^{i+1}(x) & a^{i+2}(x) & \ldots & a^{m-1}(x) \\ \vdots & \vdots & \ddots & \vdots \\ a^{(i+1)i}(x) & a^{(i+2)i}(x) & \ldots & a^{(m-1)i}(x) \end{bmatrix} \quad (18)$$

for $i = 0, 1, 2, \ldots, v-1$. By pre-computing the coefficient vector $$\pi^{(i)}(x) \triangleq \Gamma_i^{(i)}(x) \cdot \Theta^{(i)}(x) \ (\mathrm{mod} g_{v-i}(x)), \quad (19)$$

$c_{v-1}(x)$ is explicitly expressed $$c_{v-1}(x) \equiv \pi^{(v-1)}(x) \cdot [c_v(x), c_{v+1}(x), \ldots, c_{m-1}(x)]^T (\mathrm{mod} g_1(x)). \quad (20)$$

And so forth, $c_{v-2}(x)$, $c_{v-3}(x)$, ..., $c_1(x)$, $c_0(x)$, are computed sequentially $$c_i(x) \equiv \pi^{(i)}(x) \cdot [c_{i+1}(x), c_{i+2}(x), \ldots, c_{m-1}(x)]^T (\mathrm{mod} g_{v-i}(x)), \quad (21)$$

for $i = v-1, v-2, \ldots, 1, 0$.

For ease of reference, we introduce two operators. $\mathcal{L}_r$ truncates a polynomial $a(x)$ to keep only its lowest $r$ terms, $$\mathcal{L}_r a(x) \triangleq a(x) \mathrm{mod} x^r. \quad (22)$$

$\mathcal{U}_r$ truncates a polynomial $a(x)$ to keep its upper terms starting with power $x^r$.

$$U_r \alpha(x) \triangleq (\alpha(x) - \mathcal{L}_r \alpha(x))/x^r. \quad (23)$$

An example encoding method can include the following:
1. Apply LFSR encoding to $a_v(x)$, $a_{v+1}(x)$, ... $a_{m-1}(x)$, respectively, with respect to $g_0(x)$ $$\varepsilon(a_i(x), g_0(x)) \rightarrow c_i(x) \triangleq [a_i(x), p_i(x)]$$

where $\deg(p_i(x)) < r_0$, for $i = v, v+1, \ldots, m-1$.
2. For $i = v-1, v-2, \ldots, 1, 0$, do:
    (a) Compute new message $$f_i(x) \triangleq x^{r_{v-i}} a_i(x) + \pi^{(i)}(x) \cdot [c_{i+1}(x), c_{i+2}(x), \ldots, c_{m-1}(x)]^T,$$

where $\pi^{(i)}(x)$ is given in (19).
    (b) Apply LFSR encoding with respect to $g_{v-i}(x)$ $$\varepsilon(U_{r_{v-i}} f_i(x), g_{v-i}(x)) \rightarrow [U_{r_{v-i}} f_i(x), p_i^*(x)].$$

(c) Determine the parity polynomial $p_i(x)$ associated with $a_i(x)$ $$p_i(x) = p_i^*(x) + \mathcal{L}_{r_{v-i}} f_i(x).$$

FIG. 3 illustrates an example of a diagram for generalized integrated interleaving of BCH codewords in accordance with a number of embodiments of the present disclosure. FIG. 3 illustrates an example of GII-BCH codewords in an example flash memory. A plurality of data portions $a_0(x)$ 320-0 to $a_7(x)$ 320-7 are each 2 KB in length. Each of the plurality of data portions $a_0(x)$ 320-0 to $a_7(x)$ 320-7 are associated with a plurality of portions of parity data $p_0(x)$ 340-0 to $p_7(x)$ 340-7. The plurality of portions of parity data $p_0(x)$ 340-0 to $p_7(x)$ 340-7 can each be a particular length. For example, a $0^{th}$ parity data $p_0(x)$ 334-0 can be 204B in length, a $1^{st}$ parity data $p_1(x)$ 340-1 can be 166B in length, a $2^{nd}$ parity data $p_2(x)$ 340-2 can be 150B in length, and a $3^{rd}$ through $7^{th}$ parity data $p_3(x)$ 340-3 to $p_7(x)$ 340-7 can each be 138B in length. While, in this example, the $0^{th}$ parity data $p_0(x)$ 340-0 is 204B in length, embodiments are not so limited. For example, any of the illustrated portions of parity data could be 204B in length with at least one of the portions of parity data being the particular length and so forth for each of the illustrated lengths. A plurality of codewords $c_0(x)$ 334-0 to $c_7(x)$ 334-7 include the plurality of data portions $a_0(x)$ 320-0 to $a_7(x)$ 320-7 and the plurality of portions of parity data $p_0(x)$ 340-0 to $p_7(x)$ 340-7.

As illustrated at the bottom of FIG. 3, a 4 KB user data sector (e.g., user data sector) 335 can be divided into 2 BCH codewords and a 16 KB (with additional parity overhead) flash page contains 8 BCH codewords. For example, codeword $c_7(x)$ and $c_6(x)$ are 4 KB in length and make up one user data sector 335 and codewords $c_7(x)$ to $c_0(x)$ are 16 KB in length and include 8 BCH codewords. The 16 KB section includes 4 user data sectors. To use a 4 KB data portion, each BCH interleave encodes 2 KB data with different parity length. This results in different interleave length. In this regard, GII-BCH coding allows for different interleave length without affecting the proposed encoder and/or decoder.

A first layer (e.g., first level) integrated interleaved (II) codeword (described above and also referred to herein as interleaves) $C_0$ 342 (illustrated as $C_0$ 342-0 to $C_7$ 342-7, to illustrate that the II codeword corresponds to each codeword 334-0 to 334-0 being in the set of $C_0$ 342) includes an integrated interleaving (II) of the plurality of codewords $c_0(x)$ 334-0 to $c_7(x)$ 334-7. The II codeword $C_0$ 342 has an error-correction ability indicated by t corresponding to each codeword 334. For example, the II codeword $C_0$ has a t=73 for each of the plurality of codewords $c_0(x)$ 334-0 to $c_7(x)$ 334-7. This t=73 indicates that the II codeword $C_0$ 342-0 can correct up to 73 errors for codewords $c_0(x)$ 334-0 through $c_7(x)$ 334-7. Since the II codeword $C_0$ 342 includes an integrated interleaving of the plurality of codewords $c_0(x)$ 334-0 to $c_7(x)$ 334-7, a redundancy is created. In this way, the II codeword $C_0$ 342 can protect any of the plurality of codewords $c_0(x)$ 334-0 to $c_7(x)$ 334-7, as long as none of the errors per codeword exceeds 73 (as t=73 for the II code).

In response to at least one of the plurality of codewords $c_0(x)$ 334-0 to $c_7(x)$ 334-7 including more than 73 errors, in this example, a nested generalized integrated interleaved BCH code from a plurality of nested generalized integrated interleave (GII) BCH codewords $C_1$ 346-1, $C_2$ 346-2, $C_3$ 346-3 can be used to correct the errors. The plurality of nested generalized integrated interleave (GII) BCH codewords $C_1$ 346-1, $C_2$ 346-2, $C_3$ 346-3 are generated by a corresponding adder 344-1, 344-2, 344-3 that sums the II code including interleaved data from each of the plurality of codewords $c_0(x)$ 334-0 to $c_7(x)$ 334-7. The plurality of GII codewords $C_1$ 346-1, $C_2$ 346-2, $C_3$ 346-3 are a second layer or a sub-code of the first layer of code (e.g., II codeword $C_0$ 342).

Nested GII BCH codeword refers to a codeword that is part of a nested layer, as described above. The nested codeword is generalized in that it includes data from each of the plurality of codewords $c_0(x)$ 334-0 to $c_7(x)$ 334-7 and not just a portion of them. For example, in response to a codeword including up to 79 errors, nested GII BCH codeword $C_1$ 346-1 can correct the up to 79 errors (e.g., t=79) within an interleave and therefore can correct the 78 errors. Similarly, nested GII BCH codeword $C_2$ 346-2 can correct up to 88 errors (e.g., t=88) within an interleave and nested GII BCH codeword $C_3$ 346-3 can correct up to 108 errors (e.g., t=108) within an interleave. Therefore, the II BCH codeword 342 can correct up to 73 errors for each of the plurality of codewords $c_0(x)$ 334-0 to $c_7(x)$ 334-7 and at least one of the plurality of nested GII BCH codewords can correct each of 79 errors, 88 errors, and 108 errors, respectively. In response to an interleave including more than 108 errors, a failure would occur. For example, nested GII BCH codeword $C_1$ 346-1 could correct 108 errors and any errors over that would cause the failure. In response to two or more interleaves including more than 88 errors, a failure would occur. For example, nested GII BCH codeword $C_1$ 346-1 could correct one interleave including more than 88 errors (and up to 108 errors) but a second interleave with more than 88 errors could not be corrected. Further, in response to three or more interleaves including more than 79 errors, a failure would occur. Furthermore, in response to four or more interleaves including more than 73 errors, a failure would occur.

In some previous approaches, each portion of user data that is 2 KB in length can be protected by a BCH code with t ranging from 60 to 100. If a t of 80 is assumed, the code length lies between $2^{14}$ to $2^{15}$, therefore, the code is defined in the field of $GF(2^{15})$. The length of parity overhead is 15×80=1200 bits. In at least one embodiment described herein, a sector failure rate can be maintained below 1e-12. Herein, this criterion can be used such that the (flash) page failure rate is below 1e-12. With simple interleaved 8 BCH codewords, a raw bit-error-rate (RBER) of 1.7e-3 can be achieved. Note the length of a user data sector is fixed to 4 KB, therefore, each interleave within a codeword varies slightly due to different parity length. Therefore, v=m−1=7 achieves the lowest RBER of 2.9e-3. However, it also suffers the highest and non-negligible invocation rate of 0.234, that is, nearly one out of four reads fails by self-decoding and reads an extra three sectors for nested decoding. Its random read throughput is degraded to $$\frac{1}{1+0.234 \times 3} = 58.8\%,$$

which can be undesirable. In contrast, having v=3 can achieve a great trade-off. It enables a tolerance RBER of 2.7e-3, $$\frac{2.5 - 1.7}{1.7} = 58.8\%$$

lower than a previous interleaved method, while suffering merely $$\frac{3 \times 1.72e-3}{1+3 \times 1.72e-3} = 5.23e-3$$

in random read throughput.

A method for decoding binary BCH codes by incorporating a special syndrome property can include:

$$S_{2i+1} \triangleq y(\alpha^{2i+2}) = y(\alpha^{i+1})^2 = S_i^2, i = 0, 1, 2, \ldots$$

which yields zero discrepancies at even iterations of the method. One example of a method for decoding binary BCH codes by incorporating a special syndrome property can include a simplified version of a Berlekamp-Massey method referred to as a simplified Berlekamp method. The method can perform t iterations. Similarly, the following updating method can be used to incrementally update the error locator polynomial utilizing the preceding results:

- Input:
  $[S_0, \ldots, S_{2t-1}, \overset{new}{\overline{S_{2t}, \ldots, S_{2t'-1}}}], \Lambda^{(2t)}(x), B^{(2t-1)}(x), L_\Lambda^{(2t)}, L_B^{(2t-1)}$

- For r = 2t, 2t + 2, . . . , 2t' − 2, do:
  -Compute $\Delta^{(r+2)} = \Sigma_{i=0}^{L_\Lambda^{(r)}} \Lambda_i^{(r)} \cdot S_{r-i}$
  -Compute $\Lambda^{(r+2)}(x) = \Lambda^{(r)}(x) - \Delta^{(r+2)} \cdot x^2 B^{(r-1)}(x)$
  -If $\Delta^{(r+2)} \neq 0$ and $2 L_\Lambda^{(r)} \leq r$, then
    *Set $B^{(r+1)}(x) \leftarrow (\Delta^{(r+2)})^{-1} \cdot \Lambda^{(r)}(x)$
    *Set $L_\Lambda^{(r+2)} \leftarrow L_B^{(r-1)} + 2, L_B^{(r+1)} \leftarrow L_\Lambda^{(r)}$
  -Else
    *Set $B^{(r+1)}(x) \leftarrow x^2 B^{(r-1)}(x)$
    *Set $L_B^{(r+1)} \leftarrow L_B^{(r-1)} + 2, L_\Lambda^{(r+2)} \leftarrow L_\Lambda^{(r)}$
  -endif
- endfor
- Output $\Lambda^{(2t')}(x), B^{(2t'-1)}(x), L_\Lambda^{(2t')}, L_B^{(2t'-1)}$ In existing decoding methods, those syndromes can be computed from scratch. The following lemma demonstrates an alternative, and much more efficient approach.

Lemma 2 Let c be a transmitted codeword and y the received word. If there are e≤t errors and let $\Lambda(x)$ be the corresponding error locator polynomial, then the higher order syndromes $S_i \triangleq y(\alpha^{i+1}) - c(\alpha^{i+1})$, i≥2t can be computed recursively through the following LFSR $$S_i = -\Lambda_1 S_{i-1} - \Lambda_2 S_{i-2} - \ldots - \Lambda_e S_{i-e}, t \geq 2t. \quad (24)$$

The decoding method is described below.
1. Input: $y=[y_0, y_1, \ldots, y_{m-1}]$
2. Compute syndromes $\{S_{2j}^{(i)}\}_{j=0}^{t_0-1}$ and set $\{S_{2j+1}^{(i)}\}_{j=0}^{t_0-1} \leftarrow \{(S_j^{(i)})^2\}_{j=0}^{t_0-1}$, for i=0, 1, . . . , m−1.
3. Apply the method with input $\{S_j^{(i)}\}_{j=0}^{2t_0-1}$ to produce error locator polynomial set $(\Lambda^{(i,2t_0)}(x), B^{(i,2t_0-1)}(x))$, for i=0, 1, . . . , m−1, respectively. For i=0, 1, . . . , m−1, if $\Lambda^{(i,2t_0)}(x)$ has exactly $L_\Lambda^{(i,2t_0)}$ distinct roots within $\{\alpha^{-i}\}_{i=0}^{n-1}$, then correct the interleave $y_i$, else save the result $(\Lambda^{(i,2t_0)}(x), B^{(i,2t_0-1)}(x))$.
4. If all successful, then return the corrected codeword $c=[c_0, c_1, \ldots, c_{m-1}]$; else if there are more than v uncorrectable interleaves, then declare failure; else denote by $I=\{l_1, l_2, \ldots, l_b\}$ the index set of the uncorrectable interleaves.
5. Compute corrupted nested interleaves $$\tilde{y}_i(x) \equiv \sum_{j \in I} \alpha^{ij}(x) y_j(x) + \sum_{j \in I^c} \alpha^{ij}(x) c_j(x) \quad (25)$$

for i=0, 1, 2, . . . , b−1.

6. Compute higher order syndromes $\{\tilde{S}_{2j}^{(i)}\}_{j=t_0}^{t_{v-i}-1}$ over each nested interleaves $y_i$, i=0, 1, 2, . . . , b−1.
7. While I≠∅, do:
   (a) Compute syndromes $$\{S_{2j}^{(l_i)}\}_{j=t_{v-b'}}^{t_{v-b}-1},$$

i=1, 2, . . . , b, through (26), $$\begin{bmatrix} S_{2j}^{(l_1)} \\ S_{2j}^{(l_2)} \\ \vdots \\ S_{2j}^{(l_b)} \end{bmatrix} = \begin{bmatrix} 1 & 1 & \cdots & 1 \\ \alpha^{(2j+1)l_1} & \alpha^{(2j+1)l_2} & \cdots & \alpha^{(2j+1)l_b} \\ \vdots & \vdots & \ddots & \vdots \\ \alpha^{(2j+1)(b-1)l_1} & \alpha^{(2j+1)(b-1)l_2} & \cdots & \alpha^{(2j+1)(b-1)l_b} \end{bmatrix}^{-1} \begin{bmatrix} \tilde{S}_{2j}^{(0)} \\ \tilde{S}_{2j}^{(1)} \\ \vdots \\ \tilde{S}_{2j}^{(b-1)} \end{bmatrix} \quad (26)$$

for j=$t_{v-b'}$, $t_{v-b}+1$, . . . , $t_{v-b}-1$, where b' is initialized to v. Compute the corresponding odd-term syndromes $$\left[S_{2j+1}^{(l_1)}, S_{2j+1}^{(l_2)}, \ldots, S_{2j+1}^{(l_b)}\right] = \left[\left(S_j^{(l_1)}\right)^2, \left(S_j^{(l_2)}\right)^2, \ldots, \left(S_j^{(l_b)}\right)^2\right]$$

for j=$t_{v-b'}$, $t_{v-b}+1$, . . . , $t_{v-b}-1$.

(b) Apply the updating method with extra inputs $$\{S_j^{(l_i)}\}_{j=2t_{v-b'}}^{2t_{v-b}-1}$$

to produce new error locator polynomial set $(\Lambda^{(l_i,2t_{v-b})}(x), B^{(l_i,2t_{v-b}-1)}(x))$, for i=b 1, 2, . . . , b, respectively. For i=1, 2, . . . , b, if $\Lambda^{(l_i,2t_{v-b})}(x)$ has exactly $L_\Lambda^{(l_i,2t_{v-b})}$ distinct roots within $\{\alpha^{-i}\}_{i=0}^{n-1}$, then correct the interleave $y_{l_i}$; else save the result $(\Lambda^{(l_i,2t_{v-b})}(x), B^{(l_i,2t_{v-b}-1)}(x))$.

(c) Let I' be the index set of newly corrected interleaves. Set I←I−I', b'←b, and b=|I|. If I'=∅ (no interleave is newly corrected) or $t_{v-b} = t_{v-b'}$ (it fails to produce extra higher order syndromes) then declare failure. If I=∅ (all remaining interleaves are corrected) then return the corrected codeword.

(d) For each i∈I', compute higher order syndromes $$\{S_{2j}^{(i)}\}_{j=t_{v-b'}}^{t_v-1}$$

through the recursive LFSR (25). Update higher order nested syndromes through $$\{\tilde{S}_{2j}^{(l)}\}_{j=t_{v-b'}}^{t_v-l-1} \leftarrow \{\tilde{S}_{2j}^{(l)} \sum_{k \in I'} \alpha^{2j+1)il} S_{2j}^{(l)}\}_{j=t_{v-b'}}^{t_v-l-1}. \quad (27)$$

for $0 \leq i < b$.

Note that the equality (27) is due to the fact: if $y'(x) = \alpha(x^i) y(x)$, then $$S_j' \triangleq y'(\alpha^{j+1}) = \alpha^{i(j+1)} y(\alpha^{j+1}) = \alpha^{i(j+1)} S_j.$$

The generalized integrated interleaving scheme for binary BCH codes described herein can provide a lower bound on the minimum distance. The encoding and decoding methods described herein provide for an improved distributed environments where interleaves are distributed into different physical units and self-decoding is sufficient under normal operation condition.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for interleaving Bose-Chaudhuri-Hocquenghem (BCH) codewords, comprising:
   receiving a request from a host to access a portion of data of a plurality of portions of data;
   receiving the plurality of portions of data at a controller from a memory device;
   encoding, using a linear-feedback-shift register (LFSR) circuit of the controller, the plurality of portions of data into a plurality of integrated interleaved (II) BCH codewords using a first generator polynomial to obtain a plurality of respective BCH codewords, wherein each of the plurality of portions of data are divided into chunks;
   encoding, using the LFSR circuit, an additional BCH codeword based at least in part on a second plurality of portions of data and on the plurality of respective BCH codewords using a second generator polynomial,
      wherein a first output is generated by encoding of the second plurality of portions of data and added to a second output from a multiplexer which receives as inputs the plurality of respective BCH codewords and the first plurality of portions of data
   outputting the plurality of respective BCH codewords and the additional BCH codeword from the controller to the memory device; and
   transferring the portion of data divided into chunks from the memory device to the host via a motherboard;
   wherein the plurality of II BCH codewords provides nonuniform redundancy that is Protected by a first-layer code.

2. The method of claim 1, wherein the plurality of respective BCH codewords and the additional BCH codeword are encoded by substituting an integrating coefficient with a polynomial of $\alpha(x^{bi})$.

3. The method of claim 1, wherein encoding the additional BCH codeword comprises encoding a generalized integrated interleaved (GII) codeword.

4. The method of claim 3, wherein encoding the plurality of respective BCH codewords comprises encoding the plurality of respective BCH codewords in a first encoding layer and encoding the additional BCH codeword comprises encoding the additional BCH codeword in a sub-layer of the first encoding layer.

5. The method of claim 1, wherein encoding the plurality of respective BCH codewords comprises encoding the plurality of respective BCH codewords in a first encoding level and encoding the additional BCH codeword comprises encoding the additional BCH codeword in a second encoding level.

6. The method of claim 1, comprising generating a second additional BCH codeword and a third additional BCH codeword associated with the second encoding level, wherein the additional BCH codeword is a first additional BCH codeword.

7. The method of claim 6, comprising correcting a number of interleaves of codewords, wherein the first additional BCH codeword is configured to correct a greater number of errors in at least one of the number of interleaves than the plurality of respective BCH codewords.

8. A method for decoding, comprising:
   receiving a request from controlling circuitry to access a portion of data of a plurality of portions of data;
   receiving the plurality of portions of data at a memory controller from a memory device;
   determining, using the memory controller, a number of Bose-Chaudhuri-Hocquenghem (BCH) code syndromes of a plurality of nested integrated interleaved (II) BCH codewords of the plurality of portions of data, wherein each of the plurality of portions of data are divided into chunks and each of the II BCH codewords nests a set of m equally protected interleaves with v more powerful codewords in a nested layer winch is a subcode of a first layer that protects a shared redundancy and wherein m and v are integers greater than 1;
   encoding, using a linear-feedback-shift register (LFSR) circuit of the controller, the plurality of portions of data using a first generator polynomial to obtain the plurality of respective nested II BCH codewords;
   locating, using the memory controller, at least one interleave of the plurality of nested II BCH codewords based on a generated error locator polynomial;
   correcting, using the memory controller, the at least one interleave; and
   sending the corrected at least one interleave from the memory controller to the memory device; and
   transferring the portion of data divided into chunks from the memory device to the host via a motherboard.

9. The method of claim 8, comprising, prior to determining the number of BCH code syndromes of the plurality of nested II BCH codewords:
   determining, using the controller, a number of BCH code syndromes of a plurality of II BCH codewords; and
   generating, using the controller, a prior error locator polynomial.

10. The method of claim 9, further comprising, subsequent to generating the prior error location polynomial:
  locating at least one interleave of the plurality of II BCH codewords based on the prior error locator polynomial; and
  in response to a number of interleaves of the plurality of II BCH codewords being uncorrectable independent of using the plurality of nested II BCH codewords, performing the determination of the number of BCH code syndromes of the plurality of nested II BCH codewords.

11. The method of claim 9, comprising, in response to the number of interleaves of the plurality of II BCH codewords being correctable:
  correcting the number of interleaves that include an error; and
  saving the corrected number of interleaves that include the error.

12. The method of claim 8, comprising generating the error locator polynomial.

13. The method of claim 8, wherein the error locator polynomial is generated using a Berlekamp method and additional syndrome inputs.

14. The method of claim 8, comprising determining higher order syndromes through a recursive linear-feedback shift registry (LFSR).

15. The method of claim 14, comprising updating at least one of the higher order syndromes based on the determined higher order syndromes determination.

16. An apparatus comprising:
  a controller configured to:
    receive a request from a host to access a portion of data of a plurality of portions of data; and
    receive the plurality of portions of data from a memory device; and
  an integrated interleaved (II) decoder coupled to the controller, and
  an encoder coupled to the controller, wherein the encoder is configured to encode a plurality of portions of data using a first generator polynomial to obtain a first plurality of respective integrated interleaved (II) Bose-Chaudhuri-Hocquenghem (BCH) codewords of a first encoding layer;
  wherein the controller is configured to:
    operate the II decoder to:
      determine a first plurality of syndromes associated with the first plurality of II BCH codewords of the plurality of portions of data, wherein each of the first plurality of II BCH codewords nests a set of m equally protected interleaves with v more powerful codewords in a nested layer which is a subcode of a first layer that protects a shared redundancy and wherein m and v are integers greater than 1;
      locate at least one interleave of the plurality of II BCH codewords based on a generated first error locator polynomial wherein the at least one interleave is divided into chunks;
      in response to a number of interleaves of the plurality of II BCH codewords being uncorrectable, determine a number of BCH code syndromes of a plurality of nested integrated interleaved (II) BCH codewords; and
      correct the at least one interleave; and
    send the corrected at least one interleave divided into chunks to the memory device; and
    transfer the portion of data from the memory device to the host via a motherboard.

17. The apparatus of claim 16, wherein the controller is further configured to operate the II decoder to, prior to correction of the at least one interleave:
  generate a second error locator polynomial; and
  locate at least one interleave of the plurality of nested II BCH codewords based on the second error locator polynomial.

18. The apparatus of claim 16, further comprising:
  an encoder, wherein the encoder is configured to:
    encode a plurality of portions of data using a first generator polynomial to obtain a first plurality of respective Bose-Chaudhuri-Hocquenghem (BCH) codewords of a first encoding layer;
    encode a second plurality of nested BCH codewords based at least in part on an additional plurality of portions of data and the first plurality of respective BCH codewords using a second generator polynomial, wherein the second plurality of nested BCH codewords are a sub-layer of the first encoding layer;
  wherein the additional plurality of portions of data is encoded by the second generator polynomial resulting in a first output.

19. The apparatus of claim 18, wherein the first output is added to a second output, wherein the second output is from a multiplexer which receives as inputs the first plurality of respective BCH codewords and the plurality of portions of data.

* * * * *